United States Patent
Kang et al.

(10) Patent No.: US 10,439,652 B2
(45) Date of Patent: Oct. 8, 2019

(54) METHOD FOR CONTROLLING DECODING PROCESS BASED ON PATH METRIC VALUE AND COMPUTING APPARATUS AND MOBILE DEVICE FOR CONTROLLING THE SAME

(71) Applicant: Samsung Electronics Co., Ltd., Suwon-si (KR)

(72) Inventors: Hyungu Kang, Suwon-si (KR); Yoochang Eun, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 431 days.

(21) Appl. No.: 15/339,264

(22) Filed: Oct. 31, 2016

(65) Prior Publication Data
US 2018/0026662 A1    Jan. 25, 2018

(30) Foreign Application Priority Data
Jul. 22, 2016    (KR) ........................ 10-2016-0093644

(51) Int. Cl.
| | |
|---|---|
| *H03M 13/00* | (2006.01) |
| *H03M 13/41* | (2006.01) |
| *H03M 13/23* | (2006.01) |
| *H03M 13/39* | (2006.01) |
| *H04L 1/00* | (2006.01) |
| *H04W 72/04* | (2009.01) |
| *H03M 13/37* | (2006.01) |
| *H04W 84/04* | (2009.01) |

(52) U.S. Cl.
CPC ......... *H03M 13/413* (2013.01); *H03M 13/23* (2013.01); *H03M 13/3738* (2013.01); *H03M 13/3961* (2013.01); *H03M 13/4107* (2013.01); *H03M 13/6502* (2013.01); *H03M 13/658* (2013.01); *H03M 13/6583* (2013.01); *H04L 1/0045* (2013.01); *H04L 1/0046* (2013.01); *H04L 1/0052* (2013.01); *H04L 1/0059* (2013.01); *H04W 72/042* (2013.01); *H04W 84/042* (2013.01)

(58) Field of Classification Search
None
See application file for complete search history.

(56) References Cited

U.S. PATENT DOCUMENTS

| | | | |
|---|---|---|---|
| 6,108,811 A | 8/2000 | Nakamura et al. | |
| 7,327,714 B2 | 2/2008 | Roh et al. | |
| 8,185,811 B2 | 5/2012 | Li et al. | |

(Continued)

*Primary Examiner* — Daniel F. McMahon
(74) *Attorney, Agent, or Firm* — H.C. Park & Associates, PLC

(57) ABSTRACT

A mobile device includes a display, a mobile-communication modem including a Viterbi decoder (VD) configured to decode a tail biting convolutional code (TBCC)-encoded data, a memory coupled to the mobile-communication modem, and a wireless antenna coupled to the mobile-communication modem and to receive a Physical Downlink Control Channel (PDCCH). The VD is configured to: receive data encoded by TBCC; select a candidate to initiate a training section; determine final path metric (PM) values of possible states at a last step of the training section; determine a PM-related value based on the final PM values of the possible states; and determine an early termination of a decoding for the candidate based on the PM-related value.

18 Claims, 11 Drawing Sheets

(56) References Cited

U.S. PATENT DOCUMENTS

| | | |
|---|---|---|
| 8,433,975 B2 | 4/2013 | Hekstra et al. |
| 8,549,386 B2 | 10/2013 | Lu et al. |
| 8,681,906 B2 | 3/2014 | Malladi et al. |
| 9,083,385 B2 | 7/2015 | Wang et al. |
| 9,419,656 B2 | 8/2016 | Kuo |
| 9,686,783 B1 * | 6/2017 | Patel .................... H04L 5/0053 |
| 2006/0029167 A1 | 2/2006 | Han et al. |
| 2009/0089648 A1 | 4/2009 | Tsui et al. |
| 2009/0103659 A1 * | 4/2009 | Chen .................. H03M 13/413 375/341 |
| 2009/0213954 A1 * | 8/2009 | Bursalioglu .......... H04L 1/0631 375/262 |
| 2009/0285323 A1 * | 11/2009 | Sundberg ............. H04L 1/0631 375/267 |
| 2011/0167323 A1 | 7/2011 | Yu et al. |
| 2013/0227381 A1 * | 8/2013 | Akkarakaran ........ H03M 13/09 714/807 |
| 2014/0331111 A1 | 11/2014 | Kroeger et al. |
| 2016/0036465 A1 * | 2/2016 | Kuo ................. H03M 13/3938 714/792 |
| 2017/0033807 A1 * | 2/2017 | Kim .................. H03M 13/4115 |

* cited by examiner

METHOD FOR CONTROLLING DECODING PROCESS BASED ON PATH METRIC VALUE AND COMPUTING APPARATUS AND MOBILE DEVICE FOR CONTROLLING THE SAME

CROSS-REFERENCE TO RELATED APPLICATION

This application claims priority from and the benefit of Korean Patent Application No. 10-2016-0093644, filed on Jul. 22, 2016, which is hereby incorporated by reference for all purposes as if fully set forth herein.

BACKGROUND

Field

Exemplary embodiments relate to a method for controlling a decoding process based on a path metric value, and, more particularly, to a method for terminating a decoding process of a control channel and reducing blind decoding overload based on a path metric value.

Discussion

A Long Term Evolution (LTE) system uses Physical Downlink Control Channel (PDCCH) as a format of downlink control channel. The downlink refers to a radio communication from a base station, such as an evolved NodeB (eNodeB), to a mobile device, such as a user equipment (UE) supporting a mobile communication, e.g., LTE standards technologies. The PDCCH includes Downlink Control Information (DCI), and various formats of DCIs transport control information for one or more UEs. In an LTE system, DCIs are encoded by tail biting convolutional code (TBCC).

A UE may use a Viterbi decoding algorithm to decode the received PDCCH by a blind decoding scheme. The blind decoding according to the Viterbi decoding algorithm typically includes more than one training operations followed by a maximum likelihood path finding and a trace back operation to determine information bits, which are the most likely bits transmitted from a transmitter. The determined information bits are checked by a Cyclic Redundancy Check (CRC) and the validity of the information bits are determined based on the CRC check result.

In the blind decoding of an LTE system, control channel element (CCE) number and the aggregation level corresponding to the encoded data are unknown. Thus, the blind decoder, such as the Viterbi decoder, determines various possible sets of PDCCH data ("possible candidates") determined according to various aggregation levels and possible CCE numbers, etc. The possible sets of PDCCH data determined from the received data mapped in certain common search space and UE-specific search space are candidates for the blind decoding. The number of blinding decoding operations may vary according to the number of aggregation level and the number of carriers. In an LTE system, the number of blind decoding attempts is great and many blind decoding attempts yield useless results because incorrectly assumed parameters, such as an incorrect aggregation level, were applied. For these incorrect decoding attempts, the decoder wastes significant time and battery power. Accordingly, this blind decoding process is inefficient in terms of the decoding speed and power consumption.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments provide a method and apparatus for controlling a blind decoding process of control information.

Additional aspects will be set forth in the detailed description which follows, and, in part, will be apparent from the disclosure, or may be learned by practice of the inventive concept.

According to one or more exemplary embodiments, a computing apparatus includes a Viterbi decoder (VD) configured to decode a tail biting convolutional code (TBCC)-encoded data. The VD is configured to receive data encoded by TBCC, select a candidate to initiate a training section, determine final path metric (PM) values of possible states at a last step of the training section, determine a PM-related value based on the final PM values of the possible states, and determine an early termination of a decoding for the candidate based on the PM-related value.

According to one or more exemplary embodiments, provided is a method of controlling a decoding process of a tail biting convolutional code (TBCC)-encoded data in a decoder, the decoder configured to decode the TBCC-encoded data. The method includes receiving, at a convolutional decoder, data encoded by TBCC, selecting a candidate to initiate a training section, determining final path metric (PM) values of possible states at a last step of the training, section, determining a PM-related value based on the final PM values of the possible states, and determining an early termination of a decoding for the candidate based on the PM-related value.

According to one or more exemplary embodiments, a decoder to decode a tail biting convolutional code (TBCC)-encoded data includes a receiver to receive data encoded by TBCC, a branch metric processor to determine branch metrics, a path metric processor to determine final path metric (PM) values of possible states at a last step of a training section, and a path metric analyzer to determine a PM-related value based on the final PM values of the possible states, and to determine an, early termination of a decoding for a candidate based on the PM-related value and a PM-related threshold.

According to one or more exemplary embodiments, a mobile device includes a display, a mobile-communication modem including a Viterbi decoder (VD) configured to decode a tail biting convolutional code (TBCC)-encoded data, a memory coupled to the mobile-communication modem, and a wireless antenna coupled to the mobile-communication modem, the wireless antenna being configured to receive a Physical Downlink Control Channel (PDCCH). The VD is configured to receive data encoded by TBCC, select a candidate to initiate a training section, determine final path metric (PM) values of possible states at a last step of the training section, determine a PM-related value based on the final PM values of the possible states, and determine an early termination of a decoding for the candidate based on the PM-related value.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
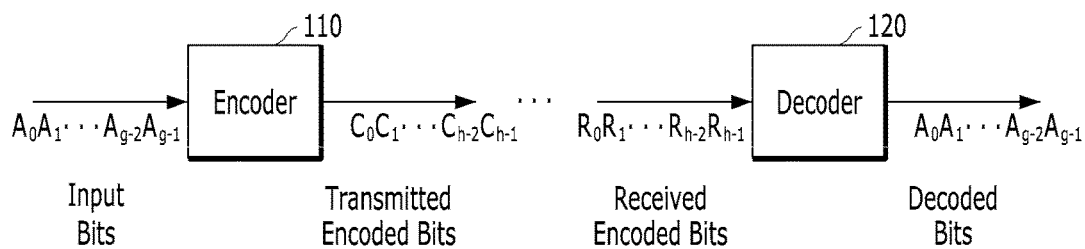
FIG. 1 illustrates a schematic diagram of a system including a convolutional encoder and a decoder to decode the output of the convolutional encoder.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, blocks, components, modules, elements, and/or aspects of the various illustrations may be otherwise combined, separated, interchanged, and/or rearranged without departing from the disclosed exemplary embodiments. Further, in the accompanying figures, the size and relative sizes of blocks, components, modules, elements, etc., may be exaggerated for clarity and descriptive purposes. Also, like reference numerals may denote like or similar elements.

When an element is, referred to as being "connected to" or "coupled to" another element, it may be directly connected to or coupled to the other element or intervening elements or may be present. When, however, an element or layer is referred to as being "directly connected to" or "directly coupled to" another element, there are no intervening elements present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 illustrates a schematic diagram of a system including a convolutional encoder and a decoder to decode the output of the convolutional encoder. Output code words, that is, encoded bits, [C0 . . . Ch-2 Ch-1] result from the convolution of a sequence of input bits [A0 . . . Ag-2 Ag-1] with the impulse response of the encoder 110 which includes a v-stage shift register (not shown). In an example, the number of total bits to be encoded is g, which is a natural number, and the number of total encoded bits is h, which depends on the code rate and the number g. At a specific time point, a sequence of n bits, that is, an n-bit code word, [C0 . . . Cn-2 Cn-1] is generated as a function of m input bits [A0 . . . Am-2 Am-1] and v bits stored in the shift register. For example, when m=1 and n=3, the convolutional encoder receives and processes one input bit and outputs three encoded bits, and then receives the next 1-bit as an input bit and outputs other three encoded bits. The constraint length L of the encoder 110 is defined as m+v, and the rate of the code is determined as m/n, where n>m. The transmitted convolutionally-encoded sequence of bits or code word [C0 . . . Ch-2 Ch-1] is received at decoder 120 as [R0 . . . Rh-2 Rh-1]. In an ideal environment, the sequence of encoded bits [C0 . . . Ch-2 Ch-1] transmitted by the encoder 110 is the same as the encoded bits [R0 . . . Rh-2 Rh-1] received at the decoder 120, but in reality, they are not the same because of transmission errors, noises, and/or interferences. To decode the convolutional code back to the original sequence of input bits [A0 . . . Ag-2 Ag-1], Viterbi algorithm is most frequently used, however, other algorithms may be used.

In 3rd Generation Partnership Project (3GPP) standards schemes, such as Long Term Evolution (LTE), LTE-Advanced (LTE-A), etc., a control channel is used to transmit control information regarding a mobile device (which may be referred to as a user equipment, a mobile station, etc.) from a network component, such as abase station or a base node. One skilled in the art will appreciate that the term mobile device used herein may refer to a mobile station, user equipment (in an E-UTRA system), or any other mobile wireless device capable of communicating with a wireless network. A network component, as referred to herein, includes an access node. The term access node may refer to a base station (BS), a base node, an evolved base node (eBN), a relay node, or other comparable wireless network radio receiver/transmitter components. In an LTE/E-UTRA or an LTE-A/E-UTRA system, an access node may be an eBN or a relay node. For simplicity, both LTE/E-UTRA and LTE-A/E-UTRA systems may be referred to herein as LTE systems. The terms mobile device, network component and access node are meant generically and do not limit embodiments to any particular wireless system.

Control information may include information regarding resource assignments, modulation and coding scheme, power control, preceding and/or other information for controlling the operation of a mobile device or a group of mobile devices. In LTE and LTE-A standards, a Physical. Downlink Control Channel (PDCCH) includes a message transmitted by a network component known as a Downlink Control Information (DCI) message. Various DCI formats are defined in the above standards. One or more PDCCHs and DCIs may be transmitted in a subframe. The subframe may be 1 ms as defined in the above standards and one radio frame may include 10 subframes arranged from a subframe having subframe number 0 to a subframe having subframe number 9. In a multiple user system, DCIs may be transmitted that are intended for all users within a cell. Other DCIs may be intended only for a specific mobile station. Different DCI formats may be used for carrying different types of control information.

Various control channel formats may be used by a base station. A mobile device may not know the format of a control channel containing control information, such as the DCIs defined in 3GPP standards, before receiving the control information. A blind decoding scheme may be used by a mobile device, and the mobile device may attempt to decode several hypothetical control channels or control channel candidates in accordance with the respective control channel formats based on data received from a base station. Control information that might have been transmitted on a candidate of a control channel in accordance with a control channel format may be referred to as candidate control information.

A mobile device may determine whether it has received control information correctly by checking Cyclic Redundancy Check (CRC) appended to the control information. The CRC may consist of 16 bits. In an example, the CRC may be scrambled with the intended mobile identity, such as Radio Network Temporary Identity (RNTI) as defined in LTE or LTE-A standards. The RNTI may be configured to identify the mobile device for which the control information is intended. There are different types of RNTIs that may be attached to DCIs for different purposes. For example, it is possible that DCI format IA can attach C-RNTI for user data communication, or attach SI-RNTI for system information. Some examples of different types of RNTIs include: Random Access RNTI (RA-RNTI; Cell. RNTI (C-RNTI); Semi-Persistent Scheduling C-RNTI (SPS-RNTI); System Information RNTI (SI-RNTI); Paging RNTI (P-RNTI); Transmit Power Control-Physical Uplink Control Channel-RNTI (TPC-PUCCH-RNTI); and Transmit Power Control-Physical Uplink Shared Channel-RNTI (TPC-PUSCH-RNTI).

In an LTE system, a mobile device may monitor a set of possible or "candidate" PDCCHs, Multiple aggregation levels (e.g, 1, 2, 4, 8) are defined by "search spaces", each search space having set of candidate PDCCHs. Each candidate PDCCH may include a defined group of Control Channel Elements (CCEs) that each, in turn, includes a defined group of Resource Elements (REs). Both common search spaces and mobile device-specific search spaces are defined in an LTE system. In an LTE system, for each subframe, there are a maximum of 22 candidate PDCCHs that a blind decoder may attempt to decode. For each of the candidate PDCCHs, two different DCI payload sizes are possible, and thus a blind decoder may make a maximum of 44 attempts for each subframe to decode a DCI.

Figure 2:
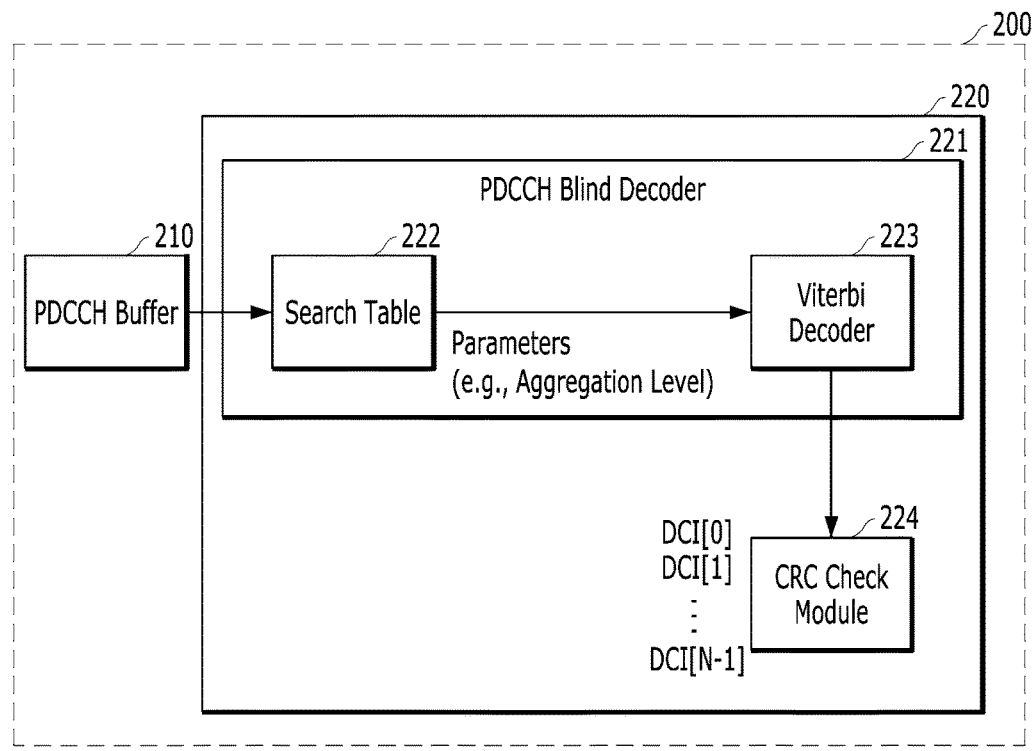
FIG. 2 is a block diagram of an example apparatus for decoding DCI included in a PDCCH.

FIG. 2 is a block diagram of an example apparatus for decoding DCI included in a PDCCH. The control channel in this embodiment is a PDCCH defined in an LTE system. The apparatus 200 includes a PDCCH buffer 210, and a DCI decoder 220. The PDCCH buffer 210 includes buffer data for all of the Control Channel Elements (CCEs) in the PDCCH search space. The buffer data, may be soft bits generated by a soft decision decoding scheme or hard bits generated by a hard decision decoding scheme. A receiver may produce a sequence of voltage samples corresponding to the parity bits that a transmitter has sent. The voltages representing the data transmitted from the transmitter may be digitized to form a received bit sequence. If this received bit sequence is decoded, the decoding process is termed hard decision decoding or "hard decoding." If the voltage samples directly decoded before digitizing them, the decoding process is termed as soft decision decoding or "soft decoding." The DCI decoder 220 includes a PDCCH blind decoder 221 and a plurality of CRC check modules 224. For each CRC check module 224, the apparatus 200 may include a respective decision module.

The DCI decoder 220 may perform blind decoding based on buffer data from the PDCCH buffer 210 to generate possible DCIs. More specifically, the PDCCH blind decoder 221 of the DCI decoder 220 blindly decodes the buffer data. In an example, the PDCCH blind decoder may include a search table 222 and a Viterbi decoder 223. The search table 222 may include definitions of the candidate DCI search spaces including the respective aggregation levels, start CCE address, and DCI formats for each of the possible candidate DCIs. Based on the information included in the search table 222, the Viterbi Decoder 223 makes a plurality of attempts to decode the buffer data contained in the PDCCH buffer 210. For a given candidate DCI in the search table, the buffer data may be decoded into the following information: a RNTI indicating a type of the RNTI and an identification of the mobile device for which the DCI is to intended; the aggregation level; the start CCE address for the PDCCH; the DCI payload; and the CRC. For each of the candidate DCIs decoded by the PDCCH blind decoder 221, this information is transmitted to the respective CRC check module 224, which checks the decoded CRC bits with the RNTI to determine whether the detection is valid. In this example, the PDCCH blind decoder 221 may make a maximum of N blind decoding attempts, where each attempt is for a different possible candidate DCI location and DCI format combination. For example, in an LTE system, N may be 44. Each attempt will generate a respective one of the possible DCIs shown as DCI[0], . . . DCI[N−1] in FIG. 2. In certain embodiments, some possible DCIs may be checked in series (sequentially) or in parallel by one or more CRC check modules. In a typical system, most of the blind decoding attempts may not produce a possible. DCI that passes the CRC check. Thus, the low efficiency of the blind decoding process and the inefficient power consumption caused by the blind decoding process are problems to be addressed.

A Viterbi decoder, e.g., the Viterbi decoder 223 of FIG. 2, may receive input bits from binary convolutional codes. The binary convolutional code may be a tail biting convolutional code. The LTE standards use a rate one third (⅓) constraint length seven (K=7) tail biting convolutional code for encoding control information sent out in the PDCCH. Since the constraint length is seven, there is 64 states in a trellis diagram, which will be discussed below. The message is protected by a 16-bit CRC, which may be XORed with a Medium Access Control (MAC) Identifier or an RNTI of the target mobile device. In a transmitter, the convolutional encoded data may be rate matched. Rate matching, describes a technique of interleaving and puncturing, e.g., omitting encoded bits or inserting encoded bits by duplicating existing bits. Viterbi decoding algorithm adopts maximum likelihood (ML) sequence estimation. A Viterbi decoder may prepend a cyclic extension of the received code word and append a cyclic extension to the code word, to decode a tail biting convolutional code. In, an LTE system, a receiver performs XOR operation with a calculated CRC and a received CRC and compares the result with its own MAC-ID, e.g., an RNTI. If the MAC-ID matches, the receiver assesses the payload.

Figure 3:
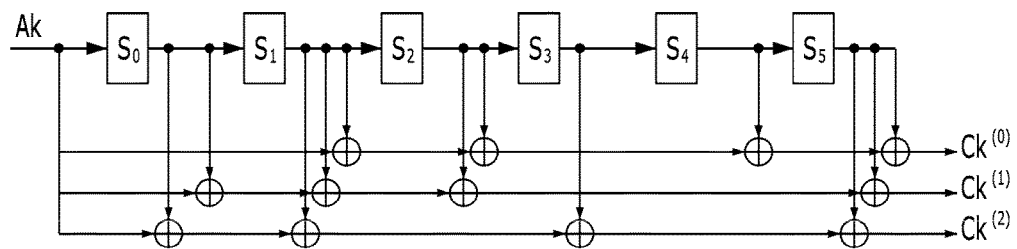
FIG. 3 shows a convolutional encoder defined in an LTE system.

FIG. 3 shows a convolutional encoder defined in an LTE system. The encoder uses the polynomials G0=133 (octal), G1=171 (octal), G2=165 (octal). The adders shown in FIG. 3 denote an XOR operation. The six delay elements s0 to s5 hold one bit each. For tail biting, the delay elements are initialized with the last six bits of the payload. For each bit Ak, the convolutional encoder produces three output bits Ck(0) to Ck(2), respectively. Those output bits are subject to rate matching and modulation. In an example, the states of the convolutional encoder are given on the left hand side of FIG. 5 in binary representation with the least significant bit to the right. The number of the six delay elements v is associated with the number of possible states $2^v$ in a trellis diagram of the corresponding Viterbi decoder.

Figure 4:
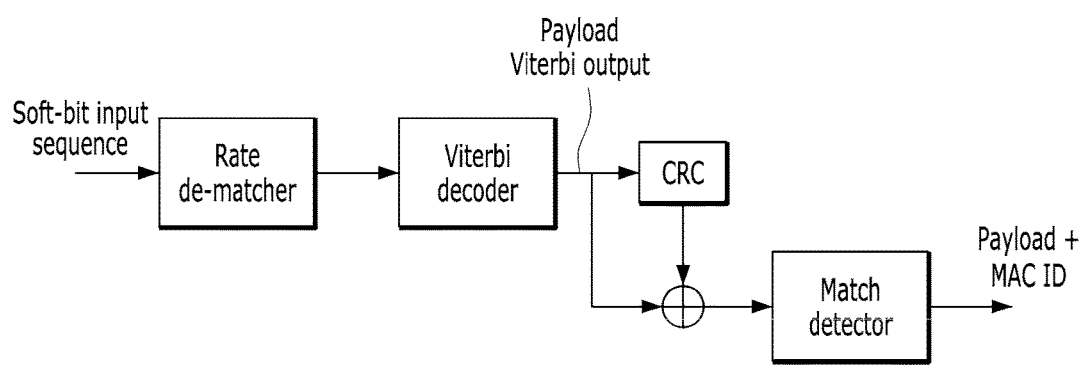
FIG. 4 is a block diagram illustrating an example of a receiver including a Viterbi decoder.

FIG. 4 is a block diagram illustrating an example of a receiver including a Viterbi decoder.

Figure 5:
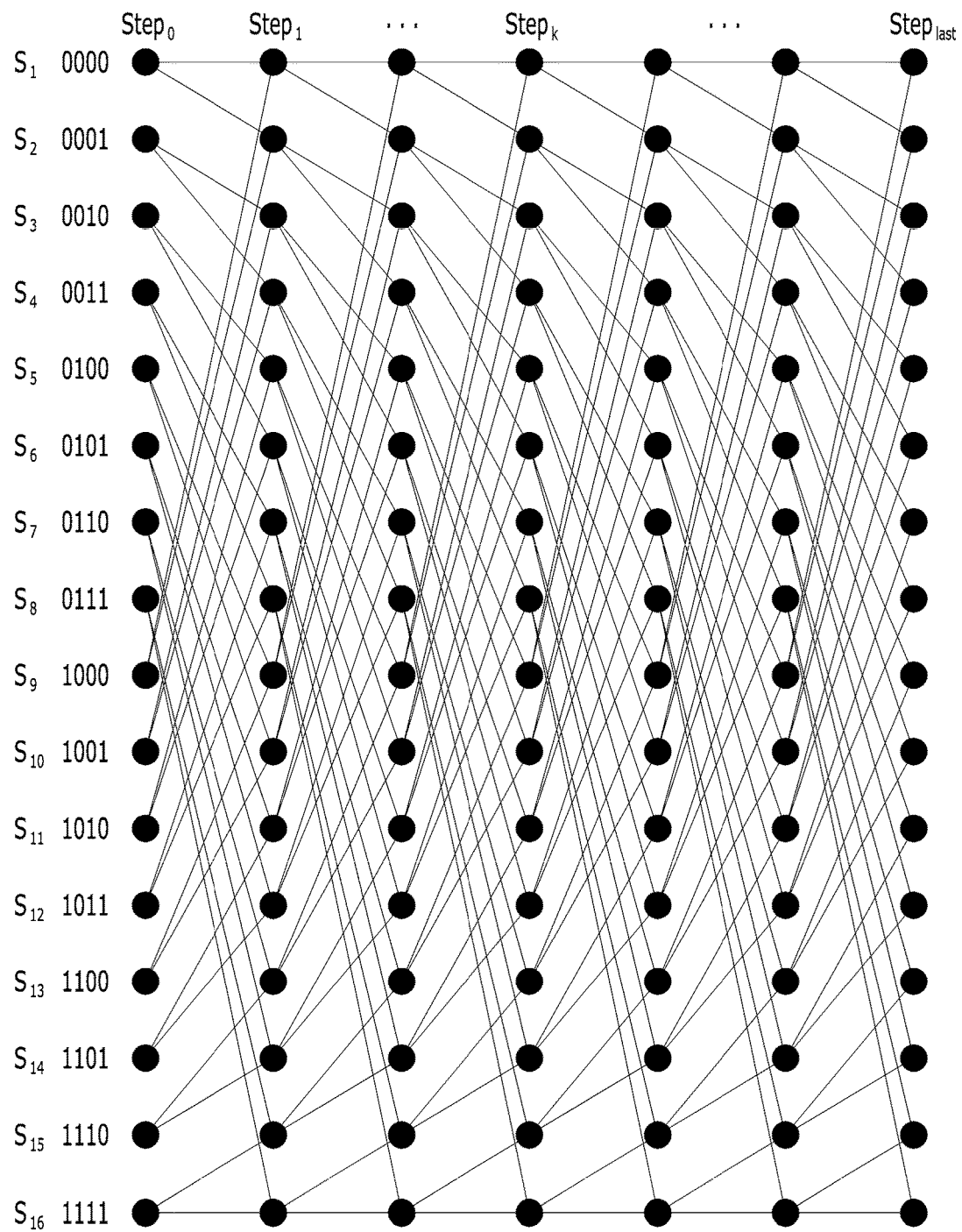
FIG. 5 is an example of a trellis diagram for a convolutional code with constraint length 5.

At the receiver, the received symbols may be first equalized and demapped. The demapping process generates soft bits that include the likelihood with which a received bit is valid according to the soft decoding scheme discussed above. In an example, a positive soft bit value represents a received logical one "1", a negative soft bit value represents a logical zero "0", and a zero value indicates equal likelihood for a logical one or zero. In another example, a negative soft bit value represents a received logical one "1", a positive soft bit value represents a logical zero "0", and a zero value indicates equal likelihood for a logical one or zero. The soft bits resulting from the demapping process may be subject to rate dematching before they are input to the convolutional decoder, e.g., a Viterbi decoder. As described above, in an LTE system, the Viterbi decoder uses 64 internal states that correspond to the possible states s0 to s5 in the convolutional encoder of the transmitter. The iterations of the Viterbi algorithms are called trellis steps and an example of a trellis diagram for a convolutional code with constraint length 5 is shown in FIG. 5.

Figure 6:
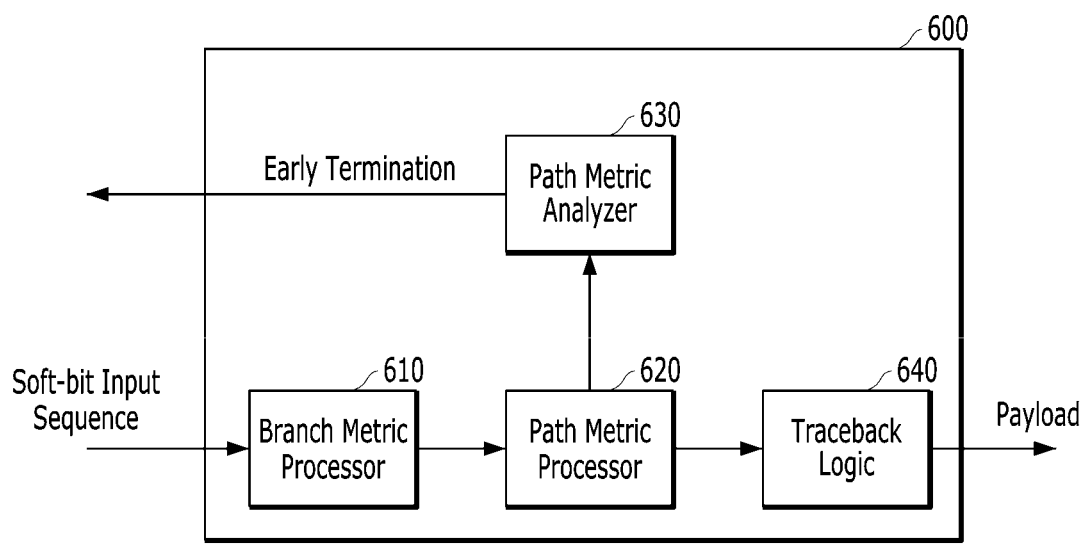
FIG. 6 is a block diagram illustrating a Viterbi decoder according to an exemplary embodiment.

FIG. 6 is a block diagram illustrating a Viterbi decoder according to an exemplary embodiment.

The Viterbi decoder 600 includes a branch metric processor 610, a path metric processor 620, a path metric analyzer 630, and a trace back logic 640. The branch metric processor 610 receives input bit sequence, such as soft-bits, and calculates branch metrics. The input bit sequence includes a plurality of bits, each of which represents a received bit along with the likelihood with which it is received. In an example, a two's complement representation of a soft bit may be chosen, and the sign thereof represents the received bit and the absolute value thereof represents the likelihood for the bit being received correctly. For a rate 1/3 convolutional code, the Viterbi decoder consumes three soft bits for each trellis step. From each triplet of soft bits, branch metric processor 610 calculates all eight possible branch metrics for the required trellis step. The calculated branch metrics are transferred to the path metric processor 620.

Figure 7:
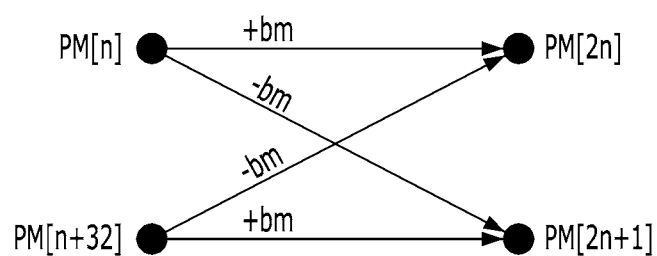
FIG. 7 is a diagram illustrating Viterbi butterfly operation.

The path metric processor 620 calculates all path metrics of the trellis from one trellis step to the next trellis step. The path metric processor 620 may include path metric register(s) that store all path metrics for each trellis step (not shown), and a path metric calculation unit (not shown). Typically, the path metric calculation unit may be Add-Compare-Select (ACS) unit, which summarizes the individual branch metrics to obtain path metrics for respective paths. One of the respective paths is chosen as optimal as being the maximum likelihood path. New path metrics depend on the path metrics calculated for the previous stage (or "previous step" or "previous trellis step") and the branch metric corresponding to the transition from the previous state to the next state. In an example, the path metric processor 620 may include 64 registers for a constraint length 7 convolutional code. The path metric calculation unit may calculate 32 butterfly operations according to a portion of trellis diagram shown in FIG. 7. For every j=0, 1, . . . , 31, the corresponding branch metric for the butterfly operation may be added and subtracted for the path metric states PM[j] and PM[j+32] of the previous trellis step to calculate possible candidates for each path metric for the current trellis step, respectively. In an example, the candidates that are the largest may be selected and used to update the states in the path metric register for PM[2j] and PM[2j+1]. In a different configuration, the candidates that are the smallest may be selected and used to update the states in the path metric register for PM[2j] and PM[2j+1]. Based on the decision whether a candidate is selected from the lower branch or the upper branch, a decision bit is determined between zero and one.

Figure 9:
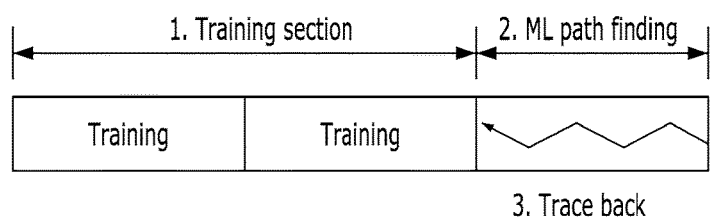
FIG. 9 is a diagram illustrating a decoding flow of a Viterbi decoder when training depth equals to 2.

A trace back memory (not shown) may be configured in the Viterbi decoder 600 to store all 64 decision bits for each trellis step. The calculation of the branch metrics and path metrics from the first trellis step to the last trellis step may be referred to as one training section. After completing one training section, another training, section may be operated. For each of possible states, e.g., total 64 states in the above example, the path metric values of the last trellis step of the previous training section may be used as initial path metric values of the first trellis step of the current training section, respectively. For the first training section, the initial path metric value for each of the possible states may be set as zero. An example of performing two training sections before performing a trace back operation is illustrated in FIG. 9.

The path metric analyzer 630 may determine whether a PM-related value is to smaller than a PM-related threshold value. Various examples of operations performed by the path metric analyzer 630 will be further described later.

After one or more of the training sections, a trace back operation may be started by the trace back logic 640. The various examples of the trace back operation of a Viterbi decoder are well known in the art. Accordingly, the detailed description thereof will be omitted. It is known that after tracing back a certain number of iterations, it is likely that the trace back logic 640 can find the most likely path in the trellis. In FIG. 9, a trace back operation is performed after completing two training sections. The training depth refers to the total number of training sections before starting of the trace back operation. In the example of FIG. 9, the training depth is two.

Figure 8:
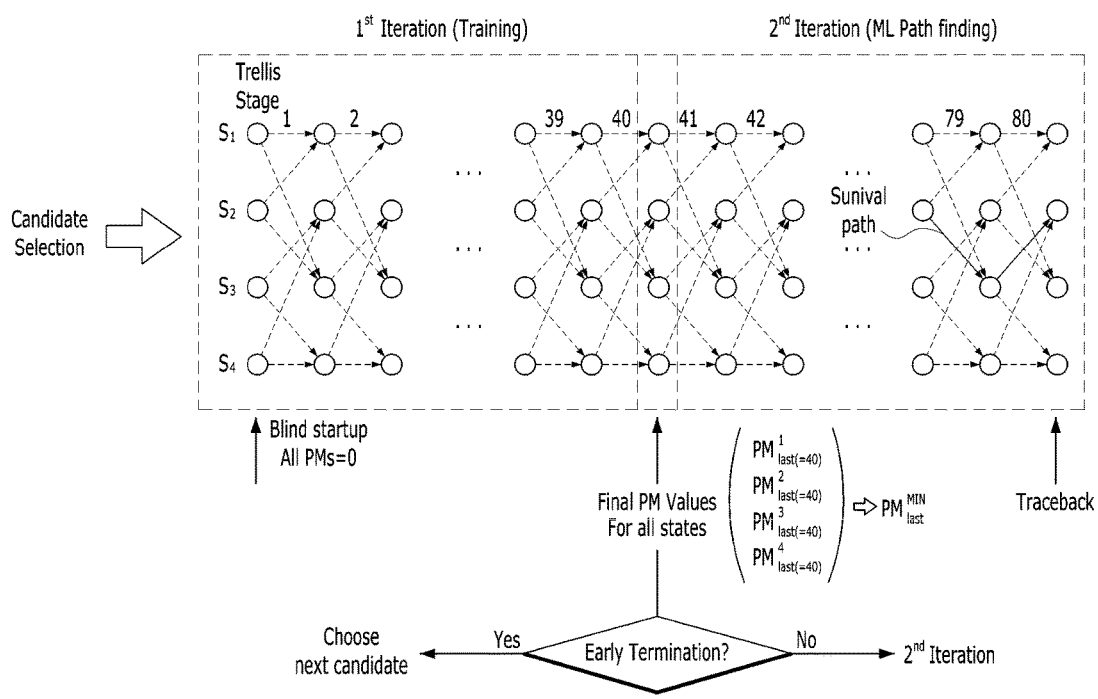
FIG. 8 is a diagram illustrating a decoding process for a 40-bit code by a Viterbi decoder according to an exemplary embodiment.

FIG. 8 is a diagram illustrating a decoding process for a 40-bit code by a Viterbi decoder according to an exemplary embodiment. FIG. 8 illustrates that the training depth is one. Referring to FIG. 8, the input bits of FIG. 1 make a transition from a present state to a next state. The n output bits are generated based on the code rate m/n. The transition from one state to the next state is called "trellis." FIG. 8 shows an example of a trellis diagram of a convolutional code with a constraint length K=3 and m=1. As described above, the constraint length is associated with the number of bits used in the encoding process. For the constraint length K=3, the number of possible states are determined based on the number of total states corresponding to v bits, i.e., 00, 01, 10, 11, for K=3 (v=2). The trellis diagram illustrates all possible transitions from a given state to the next state that can be reached from the given state. When m=1 for radix 2 configuration, there are two transitions out of a state and two transitions into a state. For m input bits at a time, there are $2^m$ transitions out of and into a state. For simplicity of description, the radix 2 configuration is described, however, one skilled in the art would recognize that inventive concept and the exemplary embodiments described herein may be applicable to radix 4, radix 8 configurations, etc. FIG. 8 shows all possible transitions from the state j to the state j+1, where j=0, 1, . . . , g−1. In the example of FIG. 8, g=40. The code rate, constraint length, the number of states, etc. may vary according to different configurations of the encoder and decoder.

According to an exemplary configuration, an input bit shifts into the least significant bit (LSB) of the first shift register while the most significant bit (MSB) shifts out of the last shift register. In this configuration, two states only differing in the MSB converge onto the same state when an input bit is shifted into the LSB. However, a different configuration may be possible. For example, an input bit shifts into the MSB of the first shift register while the LSB shifts out of the last shift register.

Referring to FIG. 8, for a decoding of a PDCCH encoded based on a TBCC, path metric values for each of the possible states may be updated by one training section. The length of the training section may correspond to the number of input bits to be encoded as control information. The training section may not store survival path information. For example, when the training section is operated before starting a maximum likelihood (ML) path finding and trace back operations, the training section may receive soft bits and perform add-compare-select (ACS) operation to update path metric values without storing survival path information. The ML path finding operation may use the final path metric value of each of the possible states obtained through the training section as the initial path metric value of the corresponding state, and perform add-compare-select operation to update path metric values. The ML path finding operation may perform the calculation performed in the training section with the setting of the final path metric value of each of the possible states obtained through the training section as the initial path metric value of the corresponding state. In addition, survival path information may be stored during the ML path finding operation such that the survival path information may be used in the trace back operation that follows the ML path finding operation.

FIG. 9 is a diagram illustrating a decoding flow of a Viterbi decoder when training depth equals to 2. According to an exemplary embodiment shown in FIG. 9, for a decoding of a PDCCH encoded based on a TBCC, path metric values for each of the possible states may be updated by one or more training sections. The length of one training section may correspond to the number of input bits of the encoded control information. One or more training sections including the first training section may not store survival path information. For example, when two training sections are operated before starting the ML path finding and trace back operations, the first training section may receive soft bits and perform add-compare-select operation to update path metric values without storing survival path information. The second training section may use the final path metric value of each of the possible states obtained through the previous training section as initial path metric value of the corresponding state, and perform add-compare-select operation to update path metric values.

Figure 10:
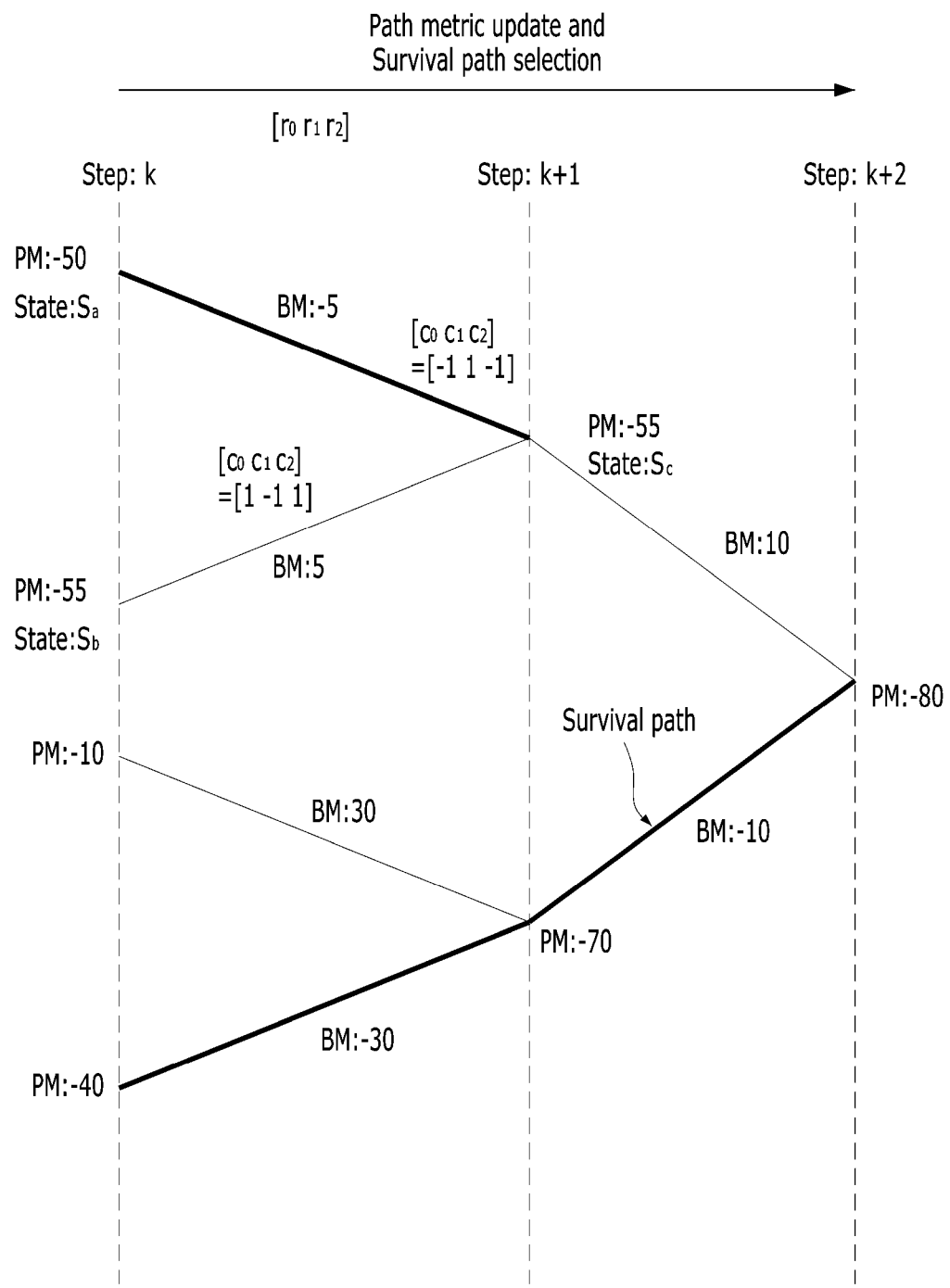
FIG. 10 illustrates a portion of a trellis diagram in the first training section operated by a convolutional decoder.

FIG. 10 illustrates a portion of a trellis diagram in the first training section operated by a convolutional decoder.

Referring to FIG. 10, in order to calculate the path metric value of step k+1, an add operation is performed by adding a path metric value of step k and a branch metric value, which is the correlation value between the input data and the code word between the step k and the step k+1. As shown in FIG. 10, the path metric (PM) value of the state Sc at step k+1 is one of the two paths that can reach the state Sc at step k+1. A path metric value is calculated through the first path from the state Sa at step k. The path metric value of the state Sa at step k is −50 and the branch metric (BM) value between the state Sa at step k and the state Sc at step k+1 is −5, which is calculated by Equation 1.

$$BM = \sum_{i=0}^{coderate-1} r_i c_i \qquad \text{[Equation 1]}$$

Where $r_i$ is a convolutionally-encoded sequence of received bits received by the decoder, and $$c_i = \begin{cases} -1, & \text{if code word} = 0 \\ +1, & \text{if code word} = 1 \end{cases}.$$

If the code word transmitted from a base station is zero, then $r_i$ may have a positive value. If the code word transmitted from a base station is one, then $r_i$ may have a negative value. In this configuration, $r_i c_i$ has a negative value when the bit value of the transmitted bit corresponds to the bit value of the received bit, e.g., the bit transmitted by the transmitter and the bit corresponding to $c_i$ are both "0" or both "1".

In a different configuration, $$c_i = \begin{cases} +1, & \text{if code word} = 0 \\ -1, & \text{if code word} = 1 \end{cases}$$

In this configuration, $r_i c_i$ has a positive value when the bit value of the transmitted bit corresponds to the bit value of the received bit, e.g., the bit transmitted by the transmitter and the bit corresponding to $c_i$ are both "0" or both "1".

The last step of the survival path for state Sk is defined as Equation 2:

$$PM_{last}^{Sk} = \sum_{j=0}^{last\ step-1} BM_j^{Sk} = \sum_{i=0}^{I-1} r_i c_i^{Sk} \quad \text{[Equation 2]}$$

where $PM_{last}^{Sk}$ is the PM value of the state Sk at the last step of a training section or the last step of a ML path finding operation. The last step is the number of information bit input to a TBCC encoder, e.g., the number 'g' of FIG. 1. $BM_j^{Sk}$ is the branch metric value of step j on the survival path of the state Sk, and I=code rate*last step, e.g., the number 'h' of FIG. 1. In other words, I is the number of bits of TBCC-encoded bits output from the encoder (or input to the Viterbi decoder) for a given candidate.

The final PM value of each state at the last step of the first training section is the cumulative BM values as shown in Equation 2, which represents the correlation between $r_i$ and $c_i$.

In the example of FIG. 10, the code rate is 3 and the BM is equal to (r0c0+r1c1+r2c2). Another path metric value is calculated through the second path from the state Sb at step k. The path metric value of the state Sb at step k is −55 and the branch metric (BM) value between the state Sb at step k and the state Sc at step k+1 is 5, which is calculated by Equation 1. Here, the code value ci between the state Sb at step k and the state Sc at step k+1 is different from the code value ci between the state Sa at step k and the state Sc at step k+1. According to the convolutional encoder and decoder configurations, the code values $c_i$ for all branches are predetermined.

In the configuration, $r_i c_i$ has a negative value when the bit value of the transmitted bit corresponds to the bit value of the received bit, e.g., the bit transmitted by the transmitter and the bit corresponding to $c_i$ are both "0" or both "1". The minimum PM value without data error is determined as Equation 3.

$$PM_{last}^{MIN} = -\sum_{i=0}^{I-1} |r_i| \quad \text{[Equation 3]}$$

If a random data input, such as received data provided to the Viterbi decoder based on a wrong aggregation level that does not match the actual aggregation level used in encoding the data at the transmitter, or data input with errors is decoded, $PM_{last}^{MIN}$ includes $r_i c_i$ terms that have positive values. Accordingly, the value of $PM_{last}^{MIN}$ is greater than $-\sum_{i=0}^{I-1} |r_i|$, Equation 4 illustrates the value when one or more $r_i c_i$ terms are positive.

$$PM_{last}^{MIN} = -\sum_{k\ \in\{sig(r_k)=c_k\}} |r_k| + \sum_{i\ \in\{sig(r_i)\neq c_i\}} |r_i| \quad \text{[Equation 4]}$$

In a PDCCH blind decoding, if the aggregation level set for the decoding in the decoder does not match to the aggregation level actually set in the TBCC encoding in the transmitter, the decoding data shows random data characteristics. Accordingly, $\sum_{i\ \in\{sig\ (r_i)\neq c_i\}} |r_i|$ terra increases and $PM_{last}^{MIN}$ also increases. Because of this characteristic, $PM_{last}^{MIN}$ may be used to determine whether the received data is being correctly decoded with appropriate assumptions, such as assumed aggregation level for the decoding.

However, if the average input level of the received data is low, $PM_{last}^{MIN}$ may have relatively lower value. If the average input level of the received data is high, $PM_{last}^{MIN}$ may have relatively higher value. In order to more correctly predict whether the received data is being correctly decoded with appropriate assumptions, the effect of the average input level can be eliminated by using a normalization. For example, a normalized minimum PM value $nPM_{last}^{MIN}$ may be defined as Equation 5.

$$nPM_{last}^{MIN} = \frac{PM_{last}^{MIN}}{\sum_{i=0}^{I-1} |r_i|} \quad \text{[Equation 5]}$$

The normalized minimum PM value without data error is determined as Equation 6.

$$nPM_{last}^{MIN} = -1 \quad \text{[Equation 6]}$$

If data error exists, the normalized minimum PM value is greater than −1.

Further, to evaluate and compare one or more digits placed to the right of the decimal point of the normalized minimum PM value, a scaling parameter may be multiplied to the normalized minimum PM value. Equation 7 shows an example using the scaling parameter, $2^n$.

$$nPM_{last}^{MIN} = \frac{PM_{last}^{MIN}}{\sum_{i=0}^{I-1} |r_i|} * 2^n, \quad \text{[Equation 7]}$$

where n in this Equation is an integer determining the scaling degree. However, the scaling parameter is not limited thereto.

In another configuration in which a PM value has the greatest value when no data error exists, the maximum PM value without data error is determined as Equation 8. This configuration may be set when $r_i c_i$ has a positive value when the bit value of the transmitted bit corresponds to the bit value of the received bit, e.g., the bit transmitted by the transmitter and the bit corresponding to $c_i$ are both "0" or both "1".

$$PM_{last}^{MAX} = \sum_{i=0}^{I-1} |r_i| \quad \text{[Equation 8]}$$

If a random data input, such as received data provided to the Viterbi decoder based on a wrong aggregation level that does not match the actual aggregation level used in encoding the data at the transmitter, or data input with errors is decoded, $PM_{last}^{MAX}$ includes $r_i c_i$ terms that have negative values. Accordingly, the value of $PM_{last}^{MAX}$ is smaller than $\sum_{i=0}^{I-1} |r_i|$. Equation 9 illustrates the value when one or more $r_i c_i$ terms are negative, e.g., by the error.

$$PM_{last}^{MAX} = \sum_{k\ \in\{sig(r_k)=c_k\}} |r_k| - \sum_{i\ \in\{sig(r_i)\neq c_i\}} |r_i|$$

Similarly, in order to more correctly predict whether the received data is being correctly decoded with appropriate assumptions, the effect of the average input level can be eliminated by using normalization. For example, a normalized maximum PM value $nPM_{last}^{MAX}$ may be defined as Equation 10.

$$nPM_{last}^{MAX} = \frac{PM_{last}^{MAX}}{\sum_{i=0}^{I-1} |r_i|} \quad \text{[Equation 10]}$$

The normalized maximum PM value without data error is determined as Equation 11.

$$nPM_{last}^{MAX} = 1 \quad \text{[Equation 11]}$$

Similar to Equation 7, a scaling parameter may be multiplied to Equation 11. Equation 12 shows an example when a scaling parameter is applied.

$$nPM_{last}^{MAX} = \frac{PM_{last}^{MAX}}{\sum_{i=0}^{I-1} |r_i|} * 2^n, \quad \text{[Equation 12]}$$

where n in this Equation is an integer determining the scaling degree. However, the scaling parameter is not limited thereto.

Figure 11:
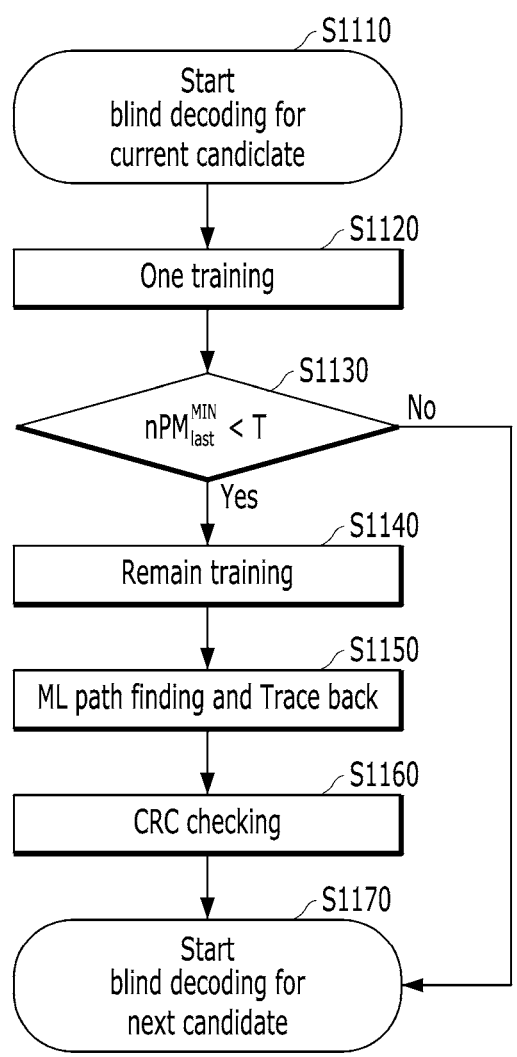
FIG. 11 is a flowchart illustrating an early termination process of a Viterbi decoding according to an exemplary embodiment.

FIG. 11 is a flowchart illustrating an early termination process of a Viterbi decoding according to an exemplary embodiment.

In operation S1110, a Viterbi decoder determines to start a binding decoding for a given candidate. The candidate may be control information with a certain assumption regarding one or more parameters, e.g., an aggregation level, a start CCE number, etc. In an LTE system, the candidate may be PDCCH including DCI.

In operation S1120, the Viterbi decoder may perform a training by calculating BM values and PM values such that each of the possible states at the last step of the trellis diagram has a final PM value. Then, the Viterbi decoder may determine the minimum PM value from among the final PM values of all of the possible states at the last step of the trellis diagram. The minimum PM value may be the value defined in Equation 13.

$$PM_{last}^{MIN} = \min_{\text{among all } s_k}(PM_{last}^{S_1}, PM_{last}^{S_2}, \ldots, PM_{last}^{S_q}) \quad \text{[Equation 13]}$$

where $q=2^v$; $k=1, 2, \ldots, q$; and v is the number of shift registers in the TBCC encoder (see 'v' defined above with respect to FIG. 1).

For example, $PM_{last}^{S_2}$ may have the minimum value among the final PM values of all possible states. In this example, $PM_{last}^{MIN}=PM_{last}^{S_2}$. After determining the $PM_{last}^{MIN}$, a normalized PM value may be determined (e.g., based on Equation 5 or Equation 7).

In operation S1130, the Viterbi decoder may determine whether the normalized PM value is smaller than a normalized PM threshold T. In an example, this operation may be performed by the path metric analyzer 630 of FIG. 6. As described above, the path metric analyzer 630 may determine whether a PM-related value is smaller than a PM-related threshold value for determining the early termination of the Viterbi decoding process. In the example of FIG. 11, the PM-related value is the "normalized PM value," which is the normalized value of the minimum PM value determined from among the final PM values of all of the possible states at the last step of the trellis diagram after completing a training section. The PM-relate threshold is the normalized PM threshold T in the example of FIG. 11. If the normalized PM value is not smaller than a normalized PM threshold T, the Viterbi decoder terminates decoding of the current candidate and starts blind decoding for the next candidate (operation S1170).

If the normalized PM value is smaller than a normalized PM threshold T, the Viterbi decoder remains in the training operation if more than one training are configured to be performed (operation S1140). In the operation S1140, the Viterbi decoder may perform further training operation by setting the final PM value of each state as an initial PM value of the corresponding state, respectively. After completing the operation S1140, operation S1150 is performed by the Viterbi decoder. Alternatively, if only one training section is configured for each candidate in the Viterbi decoder's decoding process, the operation S1140 may be omitted and, in operation S1150, the Viterbi decoder may perform ML path finding and trace back operations by setting the final PM value of each state as an initial PM value of the corresponding state, respectively. In operation S1160, the CRC checking is performed to verify the decoding of the current candidate. Then, the operation S1170 is performed with respect to the next candidate. In other words, the operations S1110 to S1170 are repeated with respect to the next candidate.

In another example, if normalization is not performed, the minimum PM value may be compared with a PM threshold without normalization. In this case, the minimum PM value may be the PM-related value, and the PM threshold without normalization may be the PM-related threshold.

Figure 12:
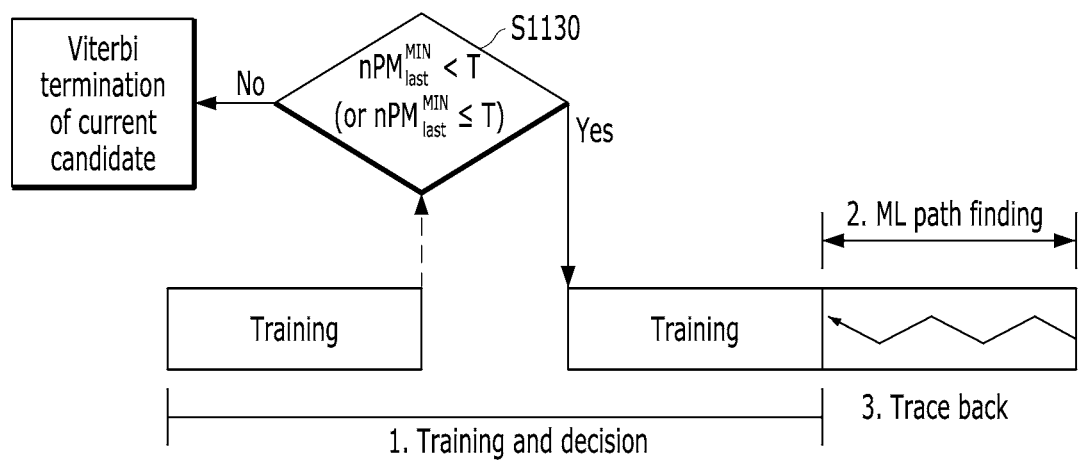
FIG. 12 is a diagram illustrating the process of FIG. 11 when two trainings are configured in a Viterbi decoder.
Figure 14:
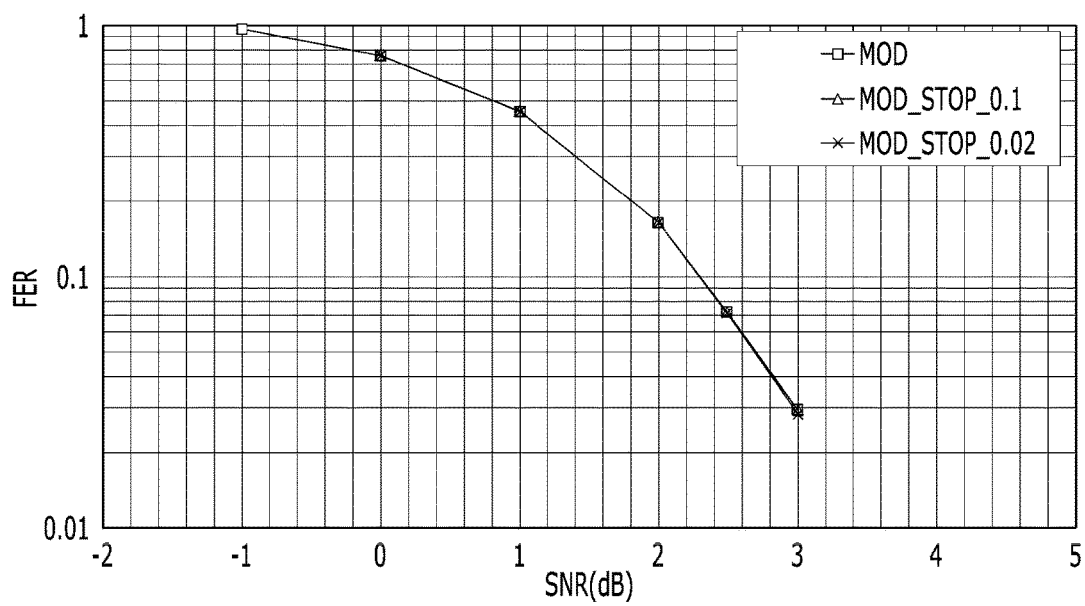
FIG. 14 illustrates FER performance for the simulation of FIG. 13.
Figure 15:
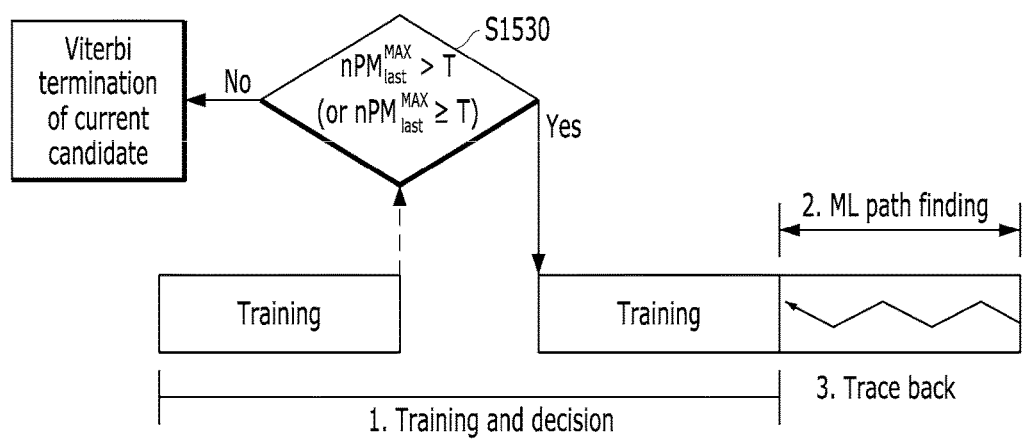
FIG. 15 is a diagram illustrating the process of FIG. 11 when two trainings are configured in a Viterbi decoder according to another exemplary embodiment.

FIG. 12 is a diagram illustrating the process of FIG. 11 when two trainings are configured in a Viterbi decoder. As shown in FIG. 12, after completing one training section, the normalized PM value is compared with the normalized PM threshold T (operation S1130). Based on the comparison, the early termination of the Viterbi decoding for the current candidate may be determined. If the early termination is not decided, the remaining training, ML path finding, and trace back operations are performed for the current candidate. Except for extraordinary circumstances, the normalized PM value calculated after one training section is a reliable parameter for the determination of the early termination as illustrated in FIG. 14 and FIG. 15 because final PM values after one training section indicate characteristics of the received bits and the random characteristics of the received bits with wrongly assumed parameters, e.g., incorrectly assumed aggregation level for a PDCCH candidate. If the early termination is performed for most of the wrong candidates, further trainings, ML path finding, and trace back operations can be omitted for the wrong candidates. If the PM-related threshold T is appropriately set, the overall decoding time of the Viterbi decoder can be significantly reduced and the power consumption for decoding can be significantly reduced. Further, the final PM values are already calculated, the additions of the decision of the minimum PM value and the threshold comparison operation do not significantly increase the processing overload.

Determination of the Normalized PM Threshold T

Equation 4 and Equation 5 suggest that $nPM_{last}^{MIN}$ is a correlation value between the received bit $r_i$ and the code word $c_i$ of the best path. In the Example of FIG. 12, decoding failure rate increases as the value of $nPM_{last}^{MIN}$ increases from −1 to 1. For example, if the received bit characteristics show that input symbol errors can be corrected if the error rate is 5% or less, then more than 5% errors will likely lead to a decoding failure after a CRC check. Accordingly, further decoding operation after one training would be waste of time and other resources. Specifically, $PM_{last}^{MIN}$ with 5% error rate can be represented as $$PM_{last}^{MIN} = -\frac{(0.95)*I}{I}*\sum_{i=0}^{I-1}|r_i| + \frac{(0.05)*I}{I}*\sum_{i=0}^{I-1}|r_i| = -0.9*\sum_{i=0}^{I-1}|r_i|$$

according to Equation 4. Thus, to perform early termination of the Viterbi decoder when 5% or more errors, the normalized PM threshold T to be compared with $nPM_{last}^{MIN}$ may be set as −0.9 (without scaling) or $-0.9*2^n$ (with scaling parameter $2^n$).

If the normalized PM threshold T is to be set for the early termination when more than p % errors, the normalized PM threshold T may be set as $$T = -\frac{(100-2p)}{100}$$

(without scaling) or $$T = -\frac{(100-2p)}{100} * 2^n$$

(with scaling parameter $2^n$). However, the scaling parameter is not limited thereto. Further, in consideration of the error correction characteristics of the received data and margin, the normalized PM threshold T may be greater than $$-\frac{(100-2p)}{100} \text{ or } -\frac{(100-2p)}{100} * 2^n$$

by adding an offset (a positive value), $$\text{e.g., } = -\frac{(100-2p)}{100} + \text{offset or}$$
$$T = -\frac{(100-2p)}{100} * 2^n + \text{offset.}$$

Figure 13:
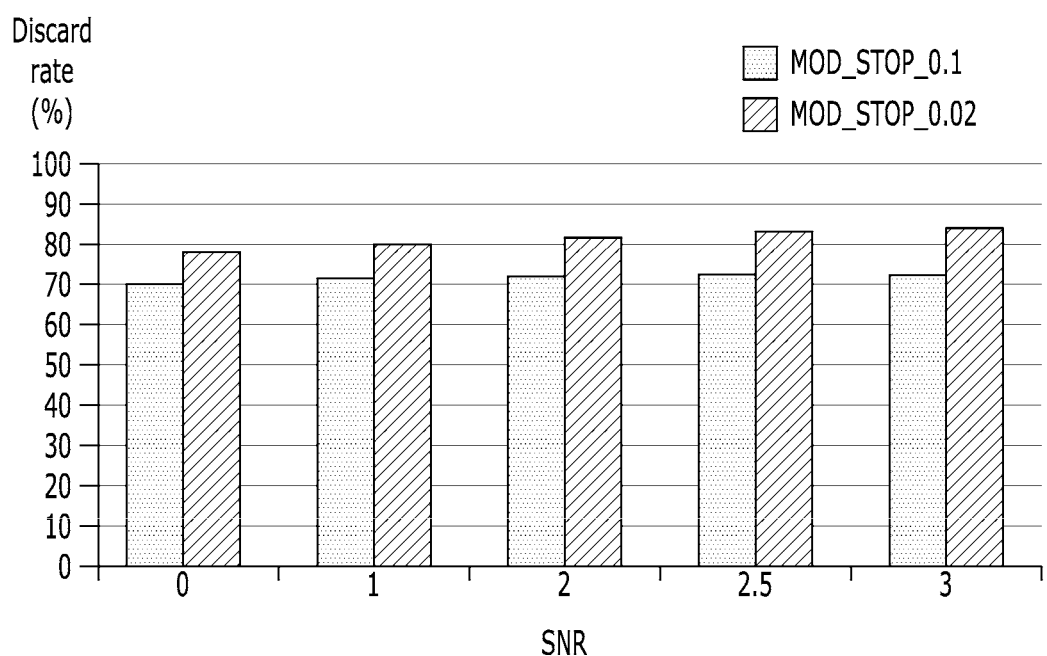
FIG. 13 illustrates the ratio of discarded candidates for two different normalized PM threshold settings.

FIG. 13 illustrates the ratio of discarded candidates for two different normalized PM threshold settings.

In the simulation of FIG. 13, PDCCH has been encoded at aggregation level 1, and blind decoding processes were performed for the error rate 2% threshold and error rate 10% threshold, respectively. In FIG. 13, 'MOD_STOP_x' indicates that the normalized PM threshold T for the early termination is set at the (x*100)% symbol error rate. When the normalized PM threshold T for the early termination is set at 2% symbol error rate, about 80% of blind decoding candidates have been discarded by the early termination of the Viterbi decoding.

FIG. 14 illustrates FER performance for the simulation of FIG. 13.

In FIG. 14, the two normalized PM threshold do not significantly deteriorate the Viterbi decoding process. Thus, the decoding speed and power reduction can be achieved by the early termination while FER is not significantly changed. In other words, if the normalized PM threshold is appropriately set in a PDCCH decoding, the decoding efficiency can be achieved without significantly affecting FER.

FIG. 15 is a diagram illustrating the process of FIG. 11 when two trainings are configured in a Viterbi decoder according to another exemplary embodiment.

As shown in FIG. 15, after completing one training section, a normalized PM value is compared with a normalized PM threshold T (operation S1530). In the example of FIG. 15, the normalize PM value may be determined based on Equation 10 or Equation 12. In this example, a PM value has the greatest value when no data error exists, the maximum PM value without data error is determined according to Equation 8. This configuration may be set when $r_ic$, has a positive value when the bit value of the transmitted bit corresponds to the bit value of the received bit, e.g., the bit transmitted by the transmitter and the bit corresponding to $c_i$ are both "0" or both "1". Further, the maximum PM value at the last step of the trellis diagram may be determined by Equation 14.

$$PM_{last}^{MAX} = \max_{among\ all\ S_k}(PM_{last}^{S1}, PM_{last}^{S2}, \ldots, PM_{last}^{Sq})$$

where $q=2^v$; $k=1, 2, \ldots, q$; and v is the number of shift registers in the TBCC encoder (see v defined above with respect to FIG. 1). The normalized PM value, $nPM_{last}^{MAX}$, may be determined based on Equation 10.

Based on the comparison of the operation S1530, the early termination of the Viterbi decoding for the current candidate may be determined. If the early termination is not decided, the remaining training, ML path finding, and trace back operations are performed for the current candidate.

In the example of FIG. 15, if the normalized PM threshold T is to be set for the early termination when more than p % errors, the normalized PM threshold T may be set as $$T = \frac{(100-2p)}{100}$$

(without scaling) or $$T = \frac{(100-2p)}{100} * 2^n$$

(with scaling parameter $2^n$). However, the scaling parameter is not limited thereto. Further, an offset (a negative value) may be added to the normalized PM threshold T in consideration of the error correction characteristics of the received data and margin.

According to an exemplary embodiment, the PM-related threshold may be dynamically controlled. In an example, if more than half candidates are determined to be wrong candidates in a subframe, the PM-related threshold may be controlled such that less early terminations are performed for the remaining candidates. Further, the PM-related threshold may be evaluated by comparing the PM-related values and the validity of the corresponding candidates. For example, such evaluations may be periodically performed in a specific subframe within each radio frame. Within the specific subframe, no early termination may be performed to accurately evaluate the PM-related threshold.

Figure 16:
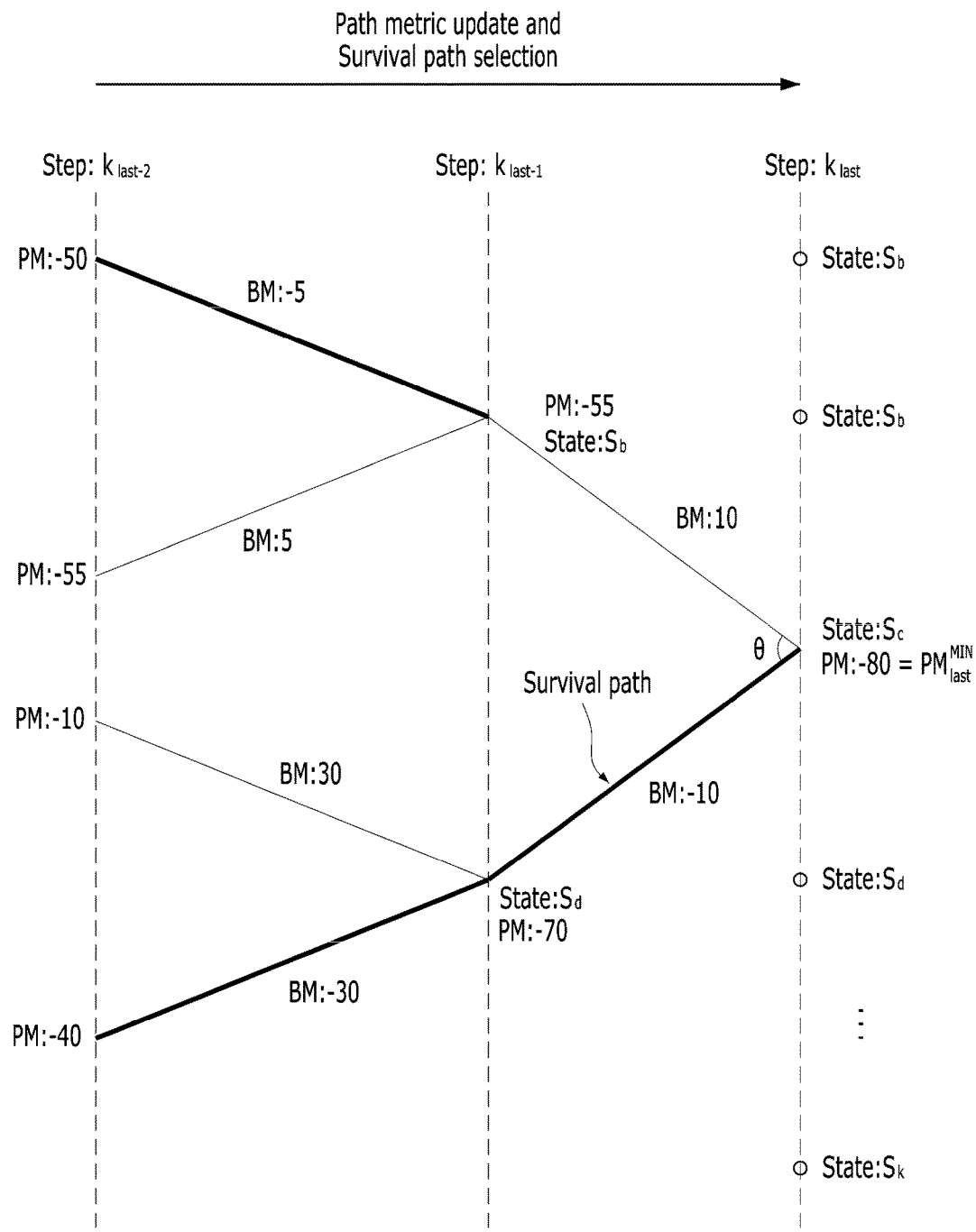
FIG. 16 illustrates a portion of a trellis diagram in a training section operated by a convolutional decoder according to an exemplary embodiment.

FIG. 16 illustrates a portion of a trellis diagram in a training section operated by a convolutional decoder according to an exemplary embodiment.

Referring to FIG. 16, the step Klast may be the last step of the first training section. In FIG. 16, among possible states, state Sc has the minimum PM value, $PM_{last}^{MIN}=-80$.

For the state Sc, which has the minimum PM value, the difference between path metric values of the last paths that reach the state Sc at the step Klast may be calculated. More specifically, in FIG. 16, the survival path to the state Sc at the step Klast is determined between the path from the state Sb at the step Klast−1 to the state Sc at the step Klast and the path from the state Sd at the step Klast−1 to the state Sc at the step Klast by comparing the path metric value PM1= (−55+10)=−45 and the path metric value PM2=(−70−10)=−80. Since −80 is smaller than −45, the path from the state Sd at the step Klast−1 to the state Sc at the step Klast is determined as the last branch of the survival path to the state Sc at the step Klast. The PM difference θ at the state having the minimum PM value at the step Klast, |PM1-PM2|, may be compared with a PM difference threshold $T_\theta$ to determine early termination of a Viterbi decoding. In this configuration, the PM difference θ at the state having the minimum PM value at the step Klast and the PM difference threshold $T_\theta$ can be used as the PM-related value and the PM-related threshold value, respectively. If the PM difference is smaller than the PM difference threshold $T_\theta$ (or, in another example, smaller than equal to $T_\theta$), the Viterbi decoder may determine early termination of the Viterbi decoding process since the small difference between PM1 and PM2 may result in a decoding failure after CRC check.

In another example, PM difference θ2 at the state having the next minimum PM value at the step Klast may also be compared with a second PM different threshold $T_{\theta 2}$. If both PM differences are smaller than the PM difference threshold $T_\theta$ and the second PM different threshold $T_{\theta 2}$, respectively, the early termination of Viterbi decoding may be determined. Further, more than two PM differences may be considered in determining the early termination of the Viterbi decoding. For example, the final PM values are sorted from the minimum value, and four states having the four lowest final PM values may be selected. Then, PM differences may be calculated with respect to the four states having the four lowest final PM values and each of the calculated PM differences may be compared with the corresponding PM difference threshold, respectively, in order to determine the early termination of the Viterbi decoding.

Figure 17:
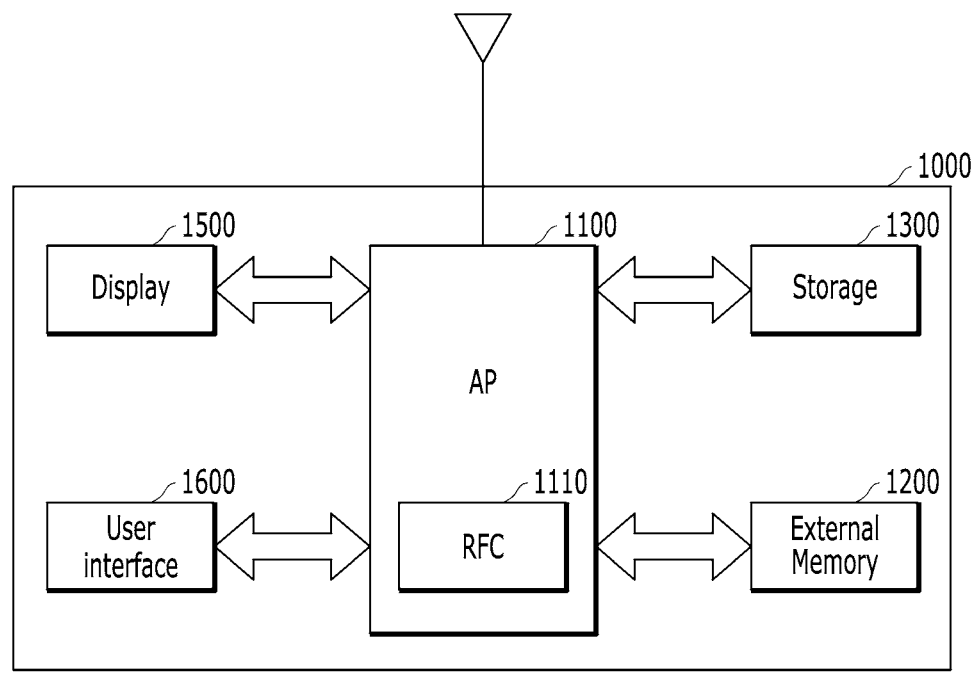
FIG. 17 is a block diagram illustrating a mobile station including an application processor, according to one or more exemplary embodiments.

FIG. 17 is a block diagram illustrating a mobile station including an application processor, according to one or more exemplary embodiments. For example, the application processor may an SoC.

Referring to FIG. 17, mobile station 1000 includes application processor 1100, external memory 1200, storage 1300, display 1500, and user interface 1600.

The application processor 1100 may control overall operations of the external memory 1200, the storage 1300, the display 1500, and the user interface 1600. The application processor 1100 may be provided as an SoC, according to one or more exemplary embodiments. The application processor 1100 includes the radio frequency communication (RFC) module 1110 coupled to antennas. In another example, the RFC module 1110 may be configured as a separate mobile-communication modem chip connected, to the application processor 1100 via a communication interface, e.g., bus, connections.

The External memory 1200 may store data processed by the application processor 1100 and data inputted through the user interface 1600. The external memory 1200 may include at least one of a static random-access memory (SRAM), a magnetoresistive random-access memory (MRAM), an embedded dynamic RAM (embedded DRAM), etc.; however, aspects of external memory 1200 are not limited thereto.

The storage 1300 may be at least one of a volatile storage and a non-volatile storage that includes various types of storages which retain stored data regardless power on/off conditions. For example, the storage 1300 includes at least one of various types such as a flash memory, a hard disk, a Read Only Memory (ROM), a Programmable ROM (PROM), an Electrically Programmable ROM (EPROM), an Electrically Erasable and Programmable ROM (EEPROM), a Phase-change RAM (PRAM), a Magnetic RAM (MRAM), a Resistive RAM (RRAM), a Ferroelectric RAM (FRAM). The storage 1300 may operate in response to a control of the application processor 1100.

The display 1500 displays information which is processed in mobile station 1000, according to a control of application processor 1100. One of the IP blocks in the application processor (AP) 1100 may be provided as a display controller coupled to the display 1500.

User interface 1600 detects a user input for controlling an operation of mobile station 1000, and generates corresponding input data. User interface 1600 may include an input device detecting a command or information from the user, such as a key pad, a mouse, a finger scan sensor, a dome switch, a touchpad, a jog wheel, and the like.

The RFC module 1110 may include at least one of Wireless Local Area Network (WLAN) communication module conforming to e.g., IEEE 802.11, and a cellular mobile communication module conforming to e.g., LTE, LTE-A, etc.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A computing apparatus comprising:
a Viterbi decoder (VD) configured to decode a tail biting convolutional code (TBCC)-encoded data,
wherein the VD is configured to:
  receive TBCC-encoded data;
  select a candidate to initiate a training section;
  determine final path metric (PM) values of possible states at a last step of the training section;
  determine a minimum PM value from among the final PM values of the possible states;
  determine a PM-related value based on the final PM values of the possible states; and
  determine an early termination of a decoding for the candidate based on the PM-related value,
wherein the PM-related value comprises a normalized minimum PM value determined by the VD via normalization of the minimum PM value, and
wherein the VD is further configured to:
  compare the PM-related value with a normalized PM threshold; and
  determine the early termination in response to the PM-related value being greater than the normalized PM threshold.

2. The computing apparatus of claim 1, wherein:
the PM-related value comprises a minimum PM value or a maximum PM value selected from among the final PM values of the possible states; and
wherein the VD is further configured to:
  compare the PM-related value with a PM-related threshold; and
  determine the early termination based on the comparison.

3. The computing apparatus of claim 1, wherein the normalized PM threshold is determined based on a symbol error rate.

4. The computing apparatus of claim 1, wherein the VD is further configured to:
determine a maximum PM value from among the final PM values of the possible states,
wherein the PM-related value comprises a normalized maximum PM value determined by the VD via normalization of the maximum PM value, and
wherein the VD is further configured to:
  compare the PM-related value with a normalized PM threshold; and determine the early termination in response to the PM-related value being smaller than the normalized PM threshold.

5. The computing apparatus of claim 1, wherein the VD is further configured to:
   determine a PM difference at a possible state that provides the minimum PM value at the last step;
   compare the PM difference with a PM difference threshold; and
   determine the early termination in response to the PM difference being smaller than the PM difference threshold.

6. The computing apparatus of claim 1, wherein, in response to a determination not to perform the early termination, the VD is further configured to:
   set the final PM values of the possible states as initial PM values of corresponding possible states, respectively, in a next training section or in a maximum likelihood (ML) path finding operation;
   determine a survival path in the ML path finding operation;
   perform a 16-bit Cyclic Redundancy Check (CRC) check based on data bits associated with the survival path; and
   determine whether the candidate is a correct candidate based on the 16-bit CRC check.

7. The computing apparatus of claim 1, wherein, in response to a determination to perform the early termination, the VD is further configured to:
   stop the decoding for the candidate; and
   initiate a training section for a next candidate.

8. The computing apparatus of claim 1, wherein:
   the TBCC-encoded data corresponds to Physical Downlink Control Channel (PDCCH) comprising Downlink Control Information (DCI); and
   the VD is configured to perform a blind decoding for a plurality of candidates with respect to at least one of aggregation levels 1, 2, 4, and 8.

9. A method of controlling a decoding process of a tail biting convolutional code (TBCC)-encoded data in a decoder, the decoder configured to decode the TBCC-encoded data, the method comprising:
   receiving, at a convolutional decoder, TBCC-encoded data;
   selecting a candidate to initiate a training section;
   determining final path metric (PM) values of possible states at a last step of the training section;
   determining a PM-related value based on the final PM values of the possible states; and
   determining an early termination of a decoding for the candidate based on the PM-related value,
   wherein determining of the PM-related value comprises:
      determining a minimum PM value from among the final PM values of the possible states; and
      determining PM-related value as a normalized minimum PM value via normalization of the minimum PM value;
   wherein determining the early termination comprises:
      comparing the PM-related value with a normalized PM threshold; and
      determining the early termination in response to the PM related value being greater than the normalized PM threshold.

10. A decoder to decode a tail biting convolutional code (TBCC)-encoded data, the decoder comprising:
    a receiver to receive TBCC-encoded data;
    a branch metric processor to determine branch metrics;
    a path metric processor to determine final path metric (PM) values of possible states at a last step of a training section; and
    a path metric analyzer to:
       determine a minimum PM value from among the final PM values of the possible states;
       determine a PM-related value based on the final PM values of the possible states; and
       determine an early termination of a decoding for a candidate based on the PM-related value and a PM-related threshold,
    wherein the PM-related value comprises a normalized minimum PM value determined by the VD via normalization of the minimum PM value, and
    wherein the path metric analyzer is further configured to:
       compare the PM-related value with a normalized PM threshold; and
       determine the early termination in response to the PM-related value being greater than the normalized PM threshold.

11. The decoder of claim 10, wherein:
    the PM-related value comprises a minimum PM value or a maximum PM value selected from among the final PM values of the possible states; and
    the path metric analyzer is configured to:
       compare the PM-related value with the PM-related threshold; and
       determine the early termination based on the comparison.

12. The decoder of claim 10, wherein the PM-related threshold is determined based on a symbol error rate, the symbol error rate is in a range of 0.001% to 50%.

13. The decoder of claim 10, wherein the path metric analyzer is further configured to:
    determine a maximum PM value from among the final PM values of the possible states,
    wherein the PM-related value comprises a normalized maximum PM value determined by the path metric analyzer via normalization of the maximum PM value, and
    wherein the path metric analyzer is further configured to:
       compare the PM-related value with the PM-related threshold; and
       determine the early termination in response to the PM-related value being smaller than the PM-related threshold.

14. The decoder of claim 10, wherein the path metric analyzer is further configured to:
    determine a PM difference at a possible state that provides the minimum PM value at the last step;
    compare the PM difference with the PM-related threshold; and
    determine the early termination in response to the PM difference being smaller than the PM-related threshold.

15. The decoder of claim 10, wherein, in response to a determination not to perform the early termination, the decoder is configured to:
    set the final PM values of the possible states as initial PM values of corresponding possible states, respectively, in a next training section or in a maximum likelihood (ML) path finding operation;
    determine a survival path in the ML path finding operation;
    perform a 16-bit Cyclic Redundancy Check (CRC) check based on data bits associated with the survival path; and
    determine whether the candidate is a correct candidate based on the 16-bit CRC check.

16. The decoder of claim 10, wherein, in response to a determination to perform the early termination, the decoder is configured to:
  stop the decoding for the candidate; and
  initiate a training section for a next candidate.

17. The decoder of claim 10, wherein:
  the TBCC-encoded data corresponds to Physical Downlink Control Channel (PDCCH) comprising Downlink Control Information (DCI); and
  the decoder is configured to perform a blind decoding for a plurality of candidates with respect to at least one of aggregation levels 1, 2, 4, and 8.

18. A mobile device comprising:
  a display;
  a mobile-communication modem comprising a Viterbi decoder (VD) configured to decode a tail biting convolutional code (TBCC)-encoded data;
  a memory coupled to the mobile-communication modem; and
  a wireless antenna coupled to the mobile-communication modem, the wireless antenna being configured to receive a Physical Downlink Control Channel (PDCCH),
wherein the VD is configured to:
  receive TBCC-encoded data;
  select a candidate to initiate a training section;
  determine final path metric (PM) values of possible states at a last step of the training section;
  determine a minimum PM value from among the final PM values of the possible states:
  determine a PM-related value as a normalized minimum PM value via normalization of the minimum PM value;
  compare the PM-related value with a normalized PM threshold; and
  determine an early termination of a decoding for the candidate in response to the PM related value being greater than the normalized PM threshold.

* * * * *